US010967655B2

(12) United States Patent
Takeuchi

(10) Patent No.: US 10,967,655 B2
(45) Date of Patent: Apr. 6, 2021

(54) PRINTER AND CONTROL METHOD FOR PRINTER

(71) Applicant: SEIKO EPSON CORPORATION, Tokyo (JP)

(72) Inventor: Katsuo Takeuchi, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/677,140

(22) Filed: Nov. 7, 2019

(65) Prior Publication Data
US 2020/0147982 A1 May 14, 2020

(30) Foreign Application Priority Data

Nov. 8, 2018 (JP) .............................. JP2018-210330

(51) Int. Cl.
| | |
|---|---|
| *B41J 11/66* | (2006.01) |
| *H03F 3/45* | (2006.01) |
| *B41J 3/407* | (2006.01) |
| *H02P 7/03* | (2016.01) |

(52) U.S. Cl.
CPC ........... *B41J 11/663* (2013.01); *B41J 3/4075* (2013.01); *H02P 7/04* (2016.02); *H03F 3/45* (2013.01); *H03F 2203/45151* (2013.01); *H03F 2203/45528* (2013.01)

(58) Field of Classification Search
CPC ....................................................... B41J 29/38
See application file for complete search history.

(56) References Cited

U.S. PATENT DOCUMENTS

| | | | | |
|---|---|---|---|---|
| 5,033,882 | A * | 7/1991 | Vanderpool | B65C 11/0289 400/88 |
| 2014/0186060 | A1* | 7/2014 | Tashiro | G03G 15/657 399/21 |
| 2015/0158314 | A1* | 6/2015 | Miyashita | G11B 5/027 347/16 |
| 2016/0227970 | A1* | 8/2016 | Diamond | B65H 35/0086 |
| 2018/0013366 | A1* | 1/2018 | Sato | B65H 5/062 |

FOREIGN PATENT DOCUMENTS

| | | |
|---|---|---|
| JP | H06-122238 A | 5/1994 |
| JP | 2003-326753 A | 11/2003 |

* cited by examiner

*Primary Examiner* — Shelby L Fidler
(74) *Attorney, Agent, or Firm* — Workman Nydegger

(57) ABSTRACT

There is provided a printer including a motor configured to convey a medium and a processor configured to control the motor. The processor acquires a signal corresponding to a counterelectromotive force of the motor and performs predetermined processing based on the acquired signal.

14 Claims, 4 Drawing Sheets

| AMOUNT OF ELECTRIC CHARGES PASSING THROUGH RESISTOR R1 | MOVING LENGTH OF MEDIUM BY PULLING |
|---|---|
| xxx1 | yyy1 |
| xxx2 | yyy2 |
| ... | ... |

PRINTER AND CONTROL METHOD FOR PRINTER

The present application is based on, and claims priority from JP Application Serial Number 2018-210330, filed Nov. 8, 2018, the disclosure of which is hereby incorporated by reference herein in its entirety.

BACKGROUND

1. Technical Field

The present disclosure relates to a printer and a control method for the printer.

2. Related Art

Researches and developments concerning conveyance of media in printers have been performed. The media are paper, a film, and the like.

Concerning the conveyance of the media, there has been known a printer including a conveyor including a driven roller for conveyance amount detection configured to come into contact with a medium conveyed by conveying means and rotate following the conveyance of the medium, a sensor configured to output a signal at each fixed rotation angle of the driven roller, means for detecting deviation of output timing of the sensor signal from a reference value or means for calculating deviation of a rotation angle of the conveying means detected at the output timing of the sensor signal from a reference value, and means for intermittently calculating, at each fixed rotation angle of the driven roller, deviation of a conveyance amount from a reference conveyance amount from the deviation of the output timing or the rotation angle. The printer is described in detail in JP-A-06-122238 (Patent Literature 1).

The printer described in Patent Literature 1 requires a rotary encoder that detects deviation of a medium that occurs when the medium is pulled. Cost and a setting place of the rotary encoder are required. Further, power consumption of the rotary encoder sometimes increases because the rotary encoder detects deviation of a medium using light emission by an LED (Light Emitting Diode). Therefore, it is sometimes difficult to reduce the power consumption of the printer.

SUMMARY

An aspect of the present disclosure is directed to a printer including: a motor configured to convey a medium; and a processor configured to control the motor. The processor acquires a signal corresponding to a counterelectromotive force of the motor and performs predetermined processing based on the acquired signal.

The printer according to the aspect of the present disclosure may employ a configuration in which the processor changes an operation mode from a normal mode in which the motor can be driven to an energy saving mode in which the motor is stopped and, when the operation mode is the energy saving mode, acquires the signal.

The printer according to the aspect of the present disclosure may employ a configuration in which the printer further includes a differential amplifier circuit, the differential amplifier circuit amplifies the signal, and the processor receives, as an interrupt signal, the signal amplified by the differential amplifier circuit even when the operation mode is the energy saving mode.

The printer according to the aspect of the present disclosure may employ a configuration in which the processor causes, as the predetermined processing, the motor to perform rewinding of the medium by length corresponding to the signal.

The printer according to the aspect of the present disclosure may employ a configuration in which the printer includes a cutter configured to cut the medium, and the processor causes, based on the acquired signal, as the predetermined processing, the cutter to cut the medium.

The printer according to the aspect of the present disclosure may employ a configuration in which the medium is a label sheet on which one or more labels are stuck, and the printer further includes a position detector configured to detect a position of the label on the label sheet.

The printer according to the aspect of the present disclosure may employ a configuration in which the printer further includes: a signal detector configured to detect the signal; and a power supply voltage detector configured to detect a power supply voltage of the motor, and, when the motor is stopped, the processor changes a state of the signal detector to a state in which the signal detector is capable of detecting the signal and changes a state of the power supply voltage detector to a state in which the power supply voltage detector is incapable of detecting the power supply voltage.

The printer according to the aspect of the present disclosure may employ a configuration in which the printer further includes: a signal detector configured to detect the signal; and a power supply voltage detector configured to detect a power supply voltage of the motor, and, when the motor is stopped, the processor receives the signal detected by the signal detector and does not receive a signal corresponding to the power supply voltage detected by the power supply voltage detector.

DESCRIPTION OF EXEMPLARY EMBODIMENTS

Embodiment

An embodiment of the present disclosure is explained below with reference to the drawings.

Overview of a Printer

First, an overview of a printer according to the embodiment is explained.

The printer according to the embodiment includes a motor that conveys a medium and a controller that controls the motor. The controller acquires a signal corresponding to a counterelectromotive force of the motor and performs predetermined processing based on the acquired signal.

The medium is a target object on which the printer prints an image of a character or the like. Types of the medium are roughly divided into a paper-based medium and a film-based medium. Specifically, the paper-based medium refers to, for example, high quality paper, cast paper, art paper, and coat paper. The film-based medium refers to synthetic paper, PET (Polyethylene terephthalate), PP (Polypropylene), and the like.

The counterelectromotive force of the motor is generated when the medium is pulled in a conveying direction of the medium by the printer and the motor rotates. That is, by acquiring the signal, the controller can detect that the medium positionally deviates by being pulled.

This means that, without including a sensor such as a rotary encoder that detects that the medium deviates by being pulled, the printer can detect that the medium deviates by being pulled using the motor that conveys the medium. As a result, compared with when the printer includes the sensor, the sensor is unnecessary and power consumption can be reduced because electric power consumed by the sensor is not consumed.

In the following explanation, the configuration of such a printer and processing performed by the controller are respectively explained. The medium is sometimes pulled in the conveying direction of the medium, for example, when the medium partially cut by a cutter of the printer with a part of the medium left uncut is torn off besides when a user of the printer pulls the medium.

Configuration of the Printer

First, the configuration of a printer 1 according to the embodiment is explained with reference to FIGS. 1 and 2.

Figure 1:
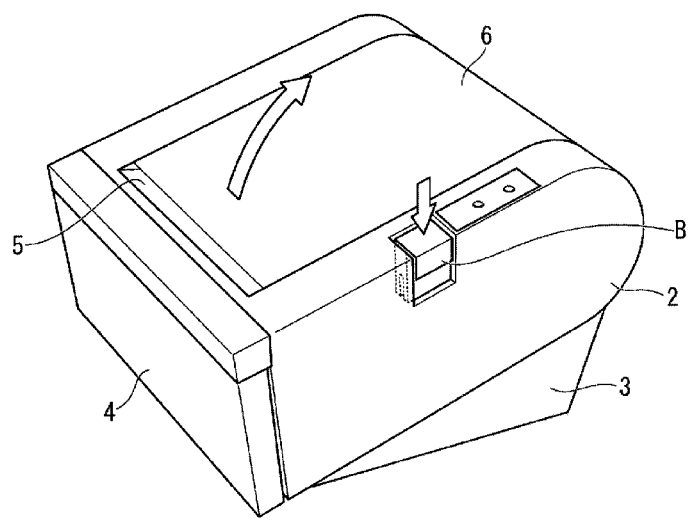
FIG. 1 is a diagram showing an example of the exterior of a printer according to an embodiment.

FIG. 1 is a diagram showing an example of the exterior of the printer 1 according to the embodiment. FIG. 2 is a diagram showing an example of an internal structure of the printer 1.

The printer 1 is, for example, a thermal printer. More specifically, the printer 1 is a direct thermal printer that thermally records an image with a thermal head 35 shown in FIG. 2. Instead of the thermal printer, the printer 1 may be another printer such as a dot impact printer that prints an image on the medium while conveying the medium with a motor.

In the printer 1, roll paper 20 is loaded as the medium on which the printer 1 prints an image. The roll paper 20 is long paper wound in a roll shape.

In the example shown in FIG. 1, the printer 1 includes an upper case 2 configuring an exterior cover, a lower case 3, and a front cover 4. In the printer 1, the upper case 2, the lower case 3, and the front cover 4 cover a printer body 11 shown in FIG. 2. The upper case 2 includes a discharge port 5 extending in the width direction of the upper case 2 and an upper cover 6 capable of opening and closing in a direction indicated by an arrow shown in FIG. 1. In the printer 1, loading and unloading of the roll paper 20 shown in FIG. 2 can be performed by opening the upper cover 6. At an upper surface side end portion of the upper case 2, an open button B for releasing a not-shown lock mechanism, which holds the upper cover 6 in a closed state, and enabling the upper cover 6 to open is provided.

Figure 2:
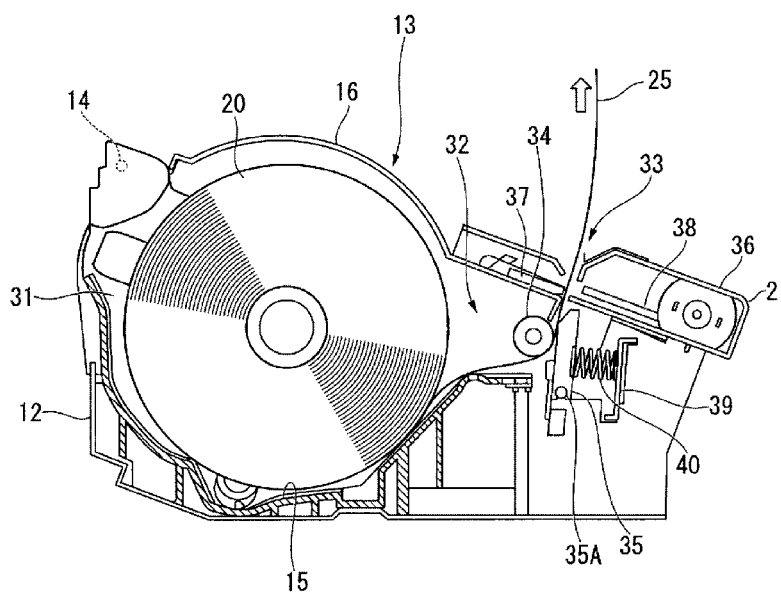
FIG. 2 is a diagram showing an example of an internal structure of the printer.

As shown in FIG. 2, the printer body 11 includes a body frame 12, a cover frame 13, a roll loader 31, a platen roller 34, a thermal head 35, and a cutter 36. The body frame 12 refers to a substantially box-like frame opened upward. The cover frame 13 refers to a frame provided in the body frame 12 to be capable of opening and closing via a support shaft 14. The cover frame 13 is attached to the rear side of the upper cover 6 and opens and closes integrally with the upper cover 6. The roll loader 31 is formed between the body frame 12 and the cover frame 13. The roll paper 20 is loaded in the roll loader 31. The platen roller 34 refers to a roller that conveys a leading end 25 of the roll paper 20 from a draw-out port 32 to a discharge port 33. The thermal head 35 is provided in a position opposed to the platen roller 34 to hold the leading end 25 between the thermal head 35 and the platen roller 34. The cutter 36 (an auto cutter) cuts off the leading end 25 discharged from the discharge port 33 after printing of an image ends.

The roll loader 31 includes a concave bottom wall 15 formed in the body frame 12 and recessed in a substantially arcuate shape along the external shape of the roll paper 20 and a convex cover 16 provided in the cover frame 13 in a position above the concave bottom wall 15 and projected in a substantially arcuate shape. In the printer 1, a housing space of the roll paper 20 is formed by the concave bottom wall 15 and the convex cover 16.

The platen roller 34 extends in the width direction of the printer body 11 and is supported by the cover frame 13. Therefore, when the cover frame 13 is opened, the platen roller 34 moves upward integrally with the cover frame 13. The platen roller 34 does not obstruct loading or unloading of the roll paper 20. Loading work or unloading work of the roll paper 20 can be easily performed.

A not-shown gear is provided at one end of a shaft of the platen roller 34. In the body frame 12, a not-shown gear transmission mechanism that meshes with the gear when the cover frame 13 is closed and a motor 43 not shown in FIGS. 1 and 2 are provided. The motor 43 is, for example, a DC (Direct Current) motor. The motor 43 may be another motor such as a stepping motor instead of the DC motor. A driving force of the motor 43 is transmitted to the platen roller 34 via the gear transmission mechanism. The leading end 25 is conveyed by the rotation of the platen roller 34. That is, the motor 43 is an example of a motor that conveys the medium.

The thermal head 35 is a line thermal head extending in the width direction with heat generating elements linearly arranged. The thermal head 35 is turnably supported by the body frame 12 via a support shaft 35A. A pressing plate 39 fixed to the body frame 12 is located on the rear surface side of the thermal head 35. An urging member 40 is interposed between the pressing plate 39 and the thermal head 35. Consequently, the thermal head 35 is configured to be urged to the platen roller 34 side by an urging member 40 to come into contact with the leading end 25 of the roll paper 20. The urging member 40 is, for example, a coil spring but is not limited to the coil spring. The head surface of the thermal head 35 is configured by a glass-based member in order to satisfy protection of the heat generating elements, a heat transfer property for transferrin heat of the heat generating elements, and wear resistance.

The cutter 36 includes a fixed blade 37 and a movable blade 38. The fixed blade 37 is attached to a cover frame 13. The movable blade 38 is attached to the body frame 12 to be capable of advancing and retracting in a direction orthogonal to the leading end 25 of the roll paper 20. When the cover frame 13 is closed, the fixed blade 37 and the movable blade 38 are disposed to be opposed to each other across a conveying path of the roll paper 20. When the movable blade 38 is driven by a not-shown movable blade driver, the movable blade 38 crosses the fixed blade 37 to cut the leading end 25 of the roll paper 20. A recess is formed in a part of the movable blade 38. The recess prevents a part of the medium from being cut. The medium is discharged as a so-called partially cut medium piece.

Figure 3:
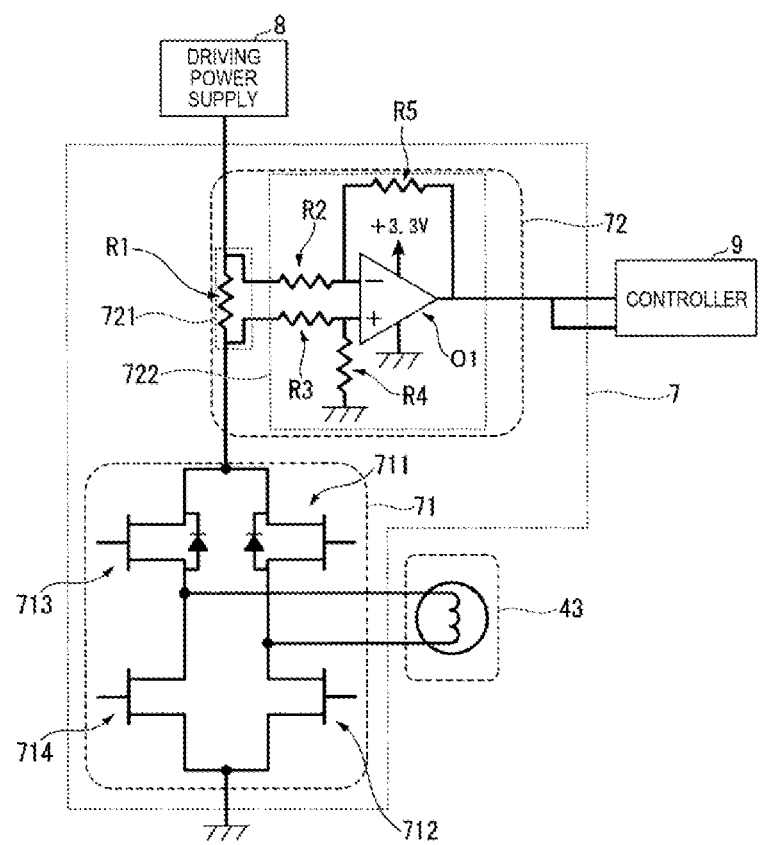
FIG. 3 is a diagram showing an example of the configuration of a driving circuit that drives a motor.

The printer 1 includes, as shown in FIG. 3, a driving circuit 7 that drives the motor 43, a driving power supply 8 that supplies electric power to the driving circuit 7, and a controller 9 that controls the motor 43 via the driving circuit 7. FIG. 3 is a diagram showing an example of the configuration of the driving circuit 7 that drives the motor 43. In FIG. 3, to simplify the figure, a transmission line coupling the driving circuit 7 and the controller 9 is omitted. In the embodiment, the transmission line may be, for example, a conductor printed on a substrate, may be a lead wire obtained by forming the conductor in a linear shape, or may be another conductor.

The driving circuit 7 includes a motor driver 71 and an amplifier circuit 72. The amplifier circuit 72 includes a signal detector 721 and a differential amplifier circuit 722.

The motor driver 71 is, for example, an H bridge circuit including four field effect transistors. The four field effect transistors are, for example, N-type field effect transistors. Apart or all of the four field effect transistors may be other field effect transistors such as P-type field effect transistors instead of the N-type field effect transistors. The motor driver 71 may be, instead of the H bridge circuit, another circuit such as a half bridge circuit capable of configuring a motor driver.

Gate terminals of the respective four field effect transistors included in the motor driver 71 are coupled to the controller 9 by a not-shown transmission line. Consequently, the controller 9 periodically switches states of the four field effect transistors to an ON state and an OFF state. That is, switching control of the motor driver 71 is performed by the controller 9. In the embodiment, when a state of a certain field effect transistor is the ON state, this means that a source terminal and a drain terminal of the field effect transistor are energized. In this embodiment, when the state of the field effect transistor is the OFF state, this means that the source terminal and the drain terminal of the field effect transistor are not energized.

In the example shown in FIG. 3, the motor driver 71 includes field effect transistors 711 to 714 respectively as the four field effect transistors.

A drain terminal of the field effect transistor 711 is coupled to a drain terminal of the field effect transistor 713 via a transmission line. A source terminal of the field effect transistor 711 is coupled to a drain terminal of the field effect transistor 712 via a transmission line. A source terminal of the field effect transistor 713 is coupled to a drain terminal of the field effect transistor 714 via a transmission line. A source terminal of the field effect transistor 712 is coupled to a source terminal of the field effect transistor 714 via a transmission line.

The transmission line coupling the drain terminal of the field effect transistor 711 and the drain terminal of the field effect transistor 713 is coupled to an output terminal of the driving power supply 8 via the amplifier circuit 72. The transmission line coupling the source terminal of the field effect transistor 712 and the source terminal of the field effect transistor 714 is grounded. The transmission line coupling the source terminal of the field effect transistor 711 and the drain terminal of the field effect transistor 712 is coupled to one of two terminals of the motor 43. The transmission line coupling the source terminal of the field effect transistor 713 and the drain terminal of the field effect transistor 714 is coupled to the other of the two terminals of the motor 43. Consequently, the driving power supply 8 can supply a DC voltage to the motor 43 via the motor driver 71.

When the medium is pulled in the conveying direction of the medium, the motor 43 rotates. A counterelectromotive force is generated between the two terminals in the motor 43 by power generating action by electromagnetic induction of the motor 43. When the counterelectromotive force is generated in the motor 43, a signal corresponding to the generated counterelectromotive force is input to the amplifier circuit 72 through respective parasitic diodes of the field effect transistor 711 and the field effect transistor 713. In the following explanation, for convenience of explanation, the signal corresponding to the counterelectromotive force generated in the motor 43 is referred to as counterelectromotive force signal. The counterelectromotive force signal refers to an electric signal.

The amplifier circuit 72 detects the counterelectromotive force signal input to the amplifier circuit 72 from the motor driver 71 in this way. The amplifier circuit 72 amplifies the detected counterelectromotive force signal and inputs the amplified counterelectromotive force signal to the controller 9.

The amplifier circuit 72 includes the signal detector 721 and the differential amplifier circuit 722.

The signal detector 721 includes a resistor R1. In the following explanation, as an example, a resistance value of the resistor R1 is 0.1 ohm. The resistor R1 is coupled between a transmission line, which couples the drain terminal of the field effect transistor 711 and the drain terminal of the field effect transistor 713, and the output terminal of the driving power supply 8. The differential amplifier circuit 722 is coupled to both ends of the resistor R1. The resistance value may be a resistance value smaller than 0.1 ohm or may be a resistance value larger than 0.1 ohm. The signal detector 721 may be configured to include another element having inductance instead of the resistor R1.

The differential amplifier circuit 722 includes resistors R2 to R5 and an operational amplifier O1.

In the following explanation, as an example, a resistance value of each of the resistor R2 and the resistor R3 is 1 kiloohm and a resistance value of each of the resistor R4 and the resistor R5 is 1 megaohm. A resistance value of one or both of the resistor R2 and the resistor R3 may be a resistance value smaller than 1 kiloohm or may be a resistance value larger than 1 kiloohm. A resistance value of one or both of the resistor R4 and the resistor R5 may be a resistance value smaller than 1 megaohm or may be a resistance value larger than 1 megaohm.

The operational amplifier O1 includes five terminals: an inverting input terminal, a non-inverting input terminal, a plus-side power supply terminal, a minus-side power supply terminal, and a signal output terminal.

One of two terminals of the resistor R2 is coupled to, via a transmission line, a terminal coupled to the driving power supply 8 of two terminals of the resistor R1. The other of the two terminals of the resistor R2 is coupled to the inverting input terminal of the operational amplifier O1 via a transmission line. One of two terminals of the resistor R3 is coupled to, via a transmission line, a terminal coupled to the motor driver 71 of the two terminals of the resistor R1. The other of the two terminals of the resistor R3 is coupled to the non-inverting input terminal of the operational amplifier O1 via a transmission line.

A DC voltage is supplied to the plus-side power supply terminal of the operational amplifier O1 via a transmission line. In the following explanation, as an example, a DC voltage of 3.3 volts is supplied to the power supply terminal. The minus-side power supply terminal of the operational amplifier O1 is grounded. The signal output terminal of the operational amplifier O1 is coupled to two signal input terminals of the controller 9 via a transmission line. One of two terminals of the resistor R5 is coupled to a transmission line that couples the resistor R2 and the plus-side power supply terminal of the operational amplifier O1. The other of the two terminals of the resistor R5 is coupled to a transmission line that couples the signal output terminal of the operational amplifier O1 and the controller 9.

With such a configuration, the amplifier circuit 72 detects, with the signal detector 721, the counterelectromotive force signal input to the amplifier circuit 72 from the motor driver 71, amplifies, with the differential amplifier circuit 722, the counterelectromotive force signal detected by the signal detector 721, and inputs the counterelectromotive force signal amplified by the differential amplifier circuit 722 to the controller 9.

The amplifier circuit 72 may be configured to include, instead of the differential amplifier circuit 722, another circuit such as a differential circuit capable of amplifying the counterelectromotive force signal input to the amplifier circuit 72 from the motor driver 71. The amplifier circuit 72 may be configured to include, instead of the signal detector 721, another circuit capable of detecting the counterelectromotive force signal input to the amplifier circuit 72 from the motor driver 71.

The controller 9 is a processor that controls the entire printer 1. The controller 9 is, for example, a CPU (Central Processing Unit). The controller 9 may be another processor such as an FPGA (Field Programmable Gate Array) instead of the CPU. The controller 9 reads out programs such as firmware stored in a memory and executes respective kinds of processing.

The controller 9 controls the printer 1 and prints an image on the medium. In this case, the controller 9 performs switching control of the four field effect transistors included in the motor driver 71 and drives the motor 43. Consequently, the controller 9 conveys the leading end 25 of the roll paper 20.

The controller 9 changes an operation mode of the printer 1 to a normal mode or an energy saving mode. When the operation mode of the printer 1 is the normal mode, this means that electric power is supplied to the entire printer 1. On the other hand, when the operation mode of the printer 1 is the energy saving mode, this means that electric power is not supplied to apart of the printer 1. For example, in the normal mode, electric power is supplied to the motor 43 to enable the motor 43 to be driven. In the energy saving mode, the motor 43 is stopped. In the energy saving mode, the part to which electric power is not supplied includes various sensors included in the printer 1 and a portion excluding a communication circuit and an interrupt processing circuit in the controller 9. That is, even when the operation mode of the printer 1 is the energy saving mode, electric power is supplied to the communication circuit and the interrupt processing circuit in the controller 9. The communication circuit refers to, among circuits included in the controller 9, a circuit that controls communication with other devices by the controller 9. The interrupt processing circuit refers to a circuit that receives, as an interrupt signal, the counterelectromotive force signal input to the controller 9. The circuits to which electric power is supplied in the case among the circuits included in the controller 9 may be configured to include other circuits in addition to the communication circuit and the interrupt processing circuit.

The interrupt processing circuit is a circuit that performs interrupt processing corresponding to the input counterelectromotive force signal when the operation mode of the printer 1 is the energy saving mode. More specifically, when a level of the input counterelectromotive force signal is equal to or larger than a predetermined threshold, the interrupt processing circuit receives the counterelectromotive force signal as an interrupt signal. On the other hand, when the level of the input counterelectromotive force signal is smaller than the threshold, the interrupt processing circuit does not receive the counterelectromotive force signal as an interrupt signal. When receiving the interrupt signal, the interrupt processing circuit changes, based on the received interrupt signal, the operation mode of the printer 1 from the energy saving mode to the normal mode more preferentially than other processing. When the operation mode is changed to the normal mode in this way, the controller 9 performs processing based on the received interrupt signal. The processing includes, for example, processing for cutting the medium with the cutter 36. For example, in the case, the controller 9 stays on standby until the level of the counterelectromotive force signal input to the interrupt processing circuit becomes smaller than the threshold. When the level of the counterelectromotive force signal input to the interrupt signal circuit becomes smaller than the threshold, the controller 9 controls the cutter 36 and cuts the medium. Consequently, the printer 1 can keep the length of a print constant. As a result, the printer 1 can improve convenience of a user who uses the printer 1 such as easiness of storage of the print. The processing may be configured to include other processing based on the interrupt signal. The controller 9 may be configured to perform the processing even when the operation mode of the printer 1 is the normal mode and the interrupt processing circuit receives the interrupt signal.

The interrupt processing circuit includes a first signal input terminal. The first signal input terminal is one of the two signal input terminals of the controller 9. When the operation mode of the printer 1 is the energy saving mode, the interrupt processing circuit performs interrupt processing corresponding to a counterelectromotive force signal input to the first signal input terminal from the signal output terminal of the operational amplifier O1.

The controller 9 includes an A (Analog)/D (Digital) conversion circuit. The A/D conversion circuit is, for example, an A/D converter. The A/D conversion circuit includes a second signal input terminal. The second signal input terminal is the other of the two signal input terminals of the controller 9. A counterelectromotive force signal input to the second signal input terminal from the signal output terminal of the operational amplifier O1 is an analog signal. The A/D conversion circuit converts the counterelectromotive force signal input to the second signal input terminal from the signal output terminal of the operational amplifier O1 into a digital signal. The controller 9 performs processing based on the counterelectromotive force signal converted into the digital signal. The controller 9 performs the processing when the operation mode of the printer 1 is changed from the energy saving mode to the normal mode by the interrupt processing. The processing includes, for example, processing for causing the motor 43 to perform rewinding of the medium by length corresponding to the counterelectromotive force signal. The rewinding of the medium refers to reverse feeding of the medium. The processing may be configured to include other processing based on the counterelectromotive force signal. The controller 9 may be configured to also perform the processing even when the operation mode of the printer 1 is the normal mode and the A/D conversion circuit receives the counterelectromotive force signal input to the first signal input terminal from the signal output terminal of the operational amplifier O1.

Figure 4:
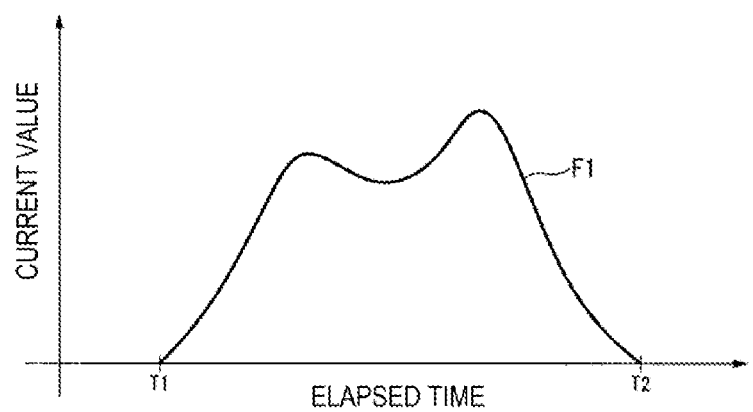
FIG. 4 is a graph showing an example of a temporal change of a current value of an electric current flowing through a resistor within a certain period.

The controller 9 calculates, based on the counterelectromotive force signal input to the second signal input terminal from the signal output terminal of the operational amplifier O1, an integrated value of a current value of an electric current flowing through the resistor R1 according to a counterelectromotive force generated in the motor 43 in a period from when the counterelectromotive force signal is started to be input to the second signal input terminal until when the input of the counterelectromotive force signal to the second signal input terminal is stopped. The current value refers to a current value of a regenerative current that flows through the resistor R1 according to counterelectromotive force generated in the motor 43. For example, the controller 9 generates information indicating a temporal change of the current value within the period. The information can be represented by, for example, a graph shown in FIG. 4. FIG. 4 is a graph showing an example of a temporal change of a current value of an electric current flowing through the resistor R1 within a certain period. The vertical axis of the graph shown in FIG. 4 indicates the current value. The horizontal axis of the graph indicates an elapsed time. A curve F1 shown in the graph indicates the temporal change of the current value. Time T1 shown in the graph indicates timing when a signal is started to be input to the second signal input terminal. Time T2 shown in the graph indicates timing when the input of the signal to the second signal input terminal is stopped. The controller 9 calculates, for example, an area between the horizontal axis of the graph and the curve F1 shown in the graph as an integrated value of the current value. The integrated value indicates an amount of electric charges passing through the resistor R1 within the period. The amount of electric charges is proportional to moving length of the medium pulled in the conveying direction of the medium within the period. This means that the controller 9 is capable of specifying, based on association information associating the amount of electric charges passing through the resistor R1 and moving length of the medium pulled in the conveying direction of the medium, the moving length of the medium pulled in the conveying direction of the medium within the period.

Figures 5, 6:
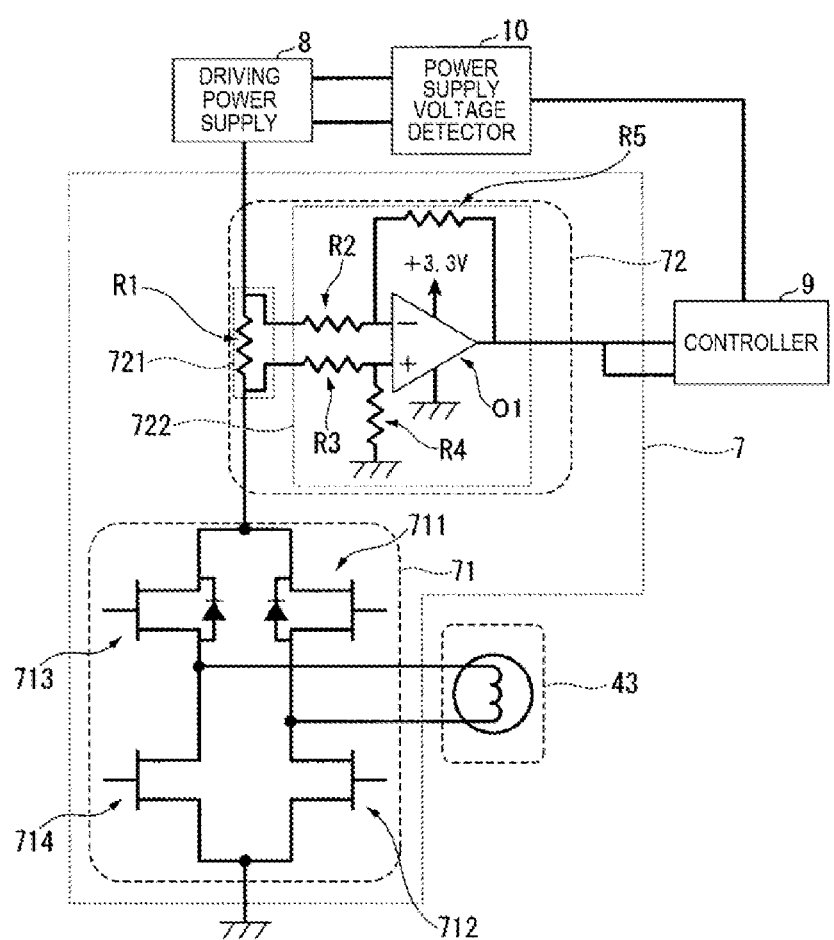
FIG. 5 is a diagram showing an example of association information associating am amount of electric charges passing through the resistor and length of movement of a medium pulled in a conveying direction of the medium.
FIG. 6 is a diagram showing an example of a power supply voltage detector coupled to a power supply voltage and a controller.

FIG. 5 is a diagram showing an example of the association information associating the amount of electric charges passing through the resistor R1 and the moving length of the medium pulled in the conveying direction of the medium. In the example shown in FIG. 5, the association information is a table associating the amount of electric charges passing through the resistor R1 and the moving length of the medium pulled in the conveying direction of the medium. The controller 9 calculates an amount of electric charges passing through the resistor R1 within a certain period and thereafter specifies, based on the calculated amount of electric charges, from the association information, length associated with the amount of electric charges as the moving length of the medium pulled in the conveying direction of the medium.

The controller 9 performs the switching control of the motor driver 71 and causes the motor 43 to perform rewinding of the medium by the moving length of the medium pulled in the conveying direction of the medium. Consequently, the printer 1 can correct a position of the medium deviating by being pulled. It is possible to prevent an amount of the medium loaded in the printer 1 from decreasing although printing is not performed. When the medium is, instead of the roll paper 20, a label sheet on which one or more labels are stuck at predetermined intervals and the label sheet is pulled, the position of a printed image with respect to the label stuck on the label sheet deviates. Therefore, the printer 1 sometimes fails in the printing on the label. The printer 1 can correct the deviating position by performing such rewinding of the medium. Even in the case, the printer 1 can prevent a situation in which the position deviates because the medium is pulled and the printer 1 fails in the printing on the label. The printer 1 may be configured to include a position detector such as an optical sensor that detects the position of the label on the label sheet. In this case, the printer 1 can precisely perform the rewinding of the medium until the position where the image is printed with respect to the label stuck on the label sheet coincides with a desired position such as the leading end of the label. That is, the printer 1 can more surely prevent the situation in which the printer 1 fails in the printing on the label because the medium is pulled.

In this way, when the medium is pulled in the conveying direction of the medium, the controller 9 performs the cutting of the medium, the rewinding of the medium, and the like. On the other hand, the printer 1 does not include a sensor such as a rotary encoder. That is, when the medium is pulled in the conveying direction of the medium, the printer 1 can perform the cutting of the medium, the rewinding of the medium, and the like without including the sensor. As a result, compared with when the printer 1 includes the sensor, the printer 1 can save cost and a setting place and can further reduce power consumption.

The amplifier circuit 72 explained above is a circuit that amplifiers the magnitude of the signal detected in the signal detector 721 to 1000 times magnitude. However, this is only an example. The signal detector 721 may be configured to amplify the magnitude of the signal to other magnitude by adjusting the resistance values of the resistor R1 to the resistor R5 or may be configured not to amplify the magnitude of the signal by adjusting the resistance values. The amplifier circuit 72 may be configured not to include the differential amplifier circuit 722.

The printer 1 explained above may be configured to include a power supply voltage detector 10 as shown in FIG. 6. FIG. 6 is a diagram showing an example of the power supply voltage detector 10 coupled to the driving power supply 8 and the controller 9. In FIG. 6, to simplify the figure, the transmission line coupling the driving circuit 7 and the controller 9 is omitted.

The power supply voltage detector 10 detects a power supply voltage of the motor 43. More specifically, the power supply voltage detector 10 detects a power supply voltage of the driving power supply 8. The power supply voltage detector 10 outputs a signal indicating the power supply voltage to the controller 9. The controller 9 determines, based on the signal received by the controller 9, whether the power supply voltage rises. When determining that the power supply voltage rises, the controller 9 stops the printer 1 because of a high voltage error. When determining that the power supply voltage is equal to or higher than a predetermined threshold voltage, the controller 9 determines that the power supply voltage rises. For example, when electric power is erroneously supplied to the printer 1 by a power supply adapter not matching the printer 1 and the power supply voltage of the driving power supply 8 rises, the controller 9 stops the printer 1 because of the high voltage error.

When a counterelectromotive force is generated in the motor 43, in the printer 1, a regenerative current generated by the counterelectromotive force flows into the driving power supply 8, whereby the power supply voltage of the driving power supply 8 rises. However, such a rise in the power supply voltage due to the counterelectromotive force is very small. An abnormality affecting circuit elements of the printer 1 rarely occurs. Therefore, when the operation mode of the printer 1 is changed from the normal mode to the energy saving mode, the controller 9 performs interrupt processing of inputs from the signal detector 721 and the power supply voltage detector 10, starts only the interrupt processing circuit of the controller 9, and causes the other functions to sleep. In this case, the controller 9 changes a state of the signal detector 721 to a state in which the signal detector 721 is capable of detecting a signal and changes a state of the power supply voltage detector 10 to a state in which the power supply voltage detector 10 is capable of detecting the power supply voltage. The controller 9 can detect a signal from the signal detector 721 as an interrupt signal in the energy saving mode, wake up the other functions, calculate an amount of electric charges passing through the resistor R1, specify, based on the calculated amount of electric charges, length associated with the amount of electric charges as moving length of the medium pulled in the conveying direction of the medium, and drive the motor 43 to rewind the medium.

Irrespective of the normal mode and the energy saving mode, the controller 9 can determine based on an input from the power supply voltage detector 10 that, when the power supply voltage of the driving power supply 8 is steadily higher by a fixed value, the power supply voltage is equal to or higher than the threshold voltage. As a result, the controller 9 can determine that the high voltage error occurs. On the other hand, irrespective of the normal mode and the energy saving mode, the controller 9 can determine based on an input from the power supply voltage detector 10 that a voltage rise due to a counterelectromotive force occurs when the power supply voltage of the driving power supply 8 is higher by a value (an indefinite value), which is not the fixed value, for a predetermined period. As a result, the controller 9 does not determine that the high voltage error occurs.

The controller 9 can also change the state of the power supply voltage detector 10 to a state in which the detection of the power supply voltage is invalid. Consequently, in the printer 1, it is possible to prevent a situation in which, when a rise in the power supply voltage generated according to the counterelectromotive force generated in the motor 43 occurs and the power supply voltage is equal to or higher than the threshold voltage, the printer 1 is stopped because the controller 9 erroneously determines that the high voltage error occurs.

When the motor 43 is stopped, the controller 9 changes the state of the signal detector 721 to a state in which the signal detector 721 is capable of detecting a signal. In this case, the signal detector 721 includes, for example, a switching element such as a field effect transistor between the inverting input terminal and the non-inverting input terminal of the operational amplifier O1. That is, the controller 9 controls the switching element to thereby change a state in which a potential difference between the inverting input terminal and the non-inverting input terminal of the operational amplifier O1 is eliminated to a state in which the potential difference can be generated. Consequently, the controller 9 changes the state of the signal detector 721 to the state in which the signal detector 721 is capable of detecting a signal. The controller 9 may be configured to change, with another method, the state of the signal detector 721 to the state in which the signal detector 721 is capable of detecting a signal.

The controller 9 may be configured to, when the motor 43 is stopped, change a setting in which the controller 9 does not receive a signal detected by the signal detector 721 to a setting in which the controller 9 receives the signal detected by the signal detector 721. That is, in the case, the controller 9 changes input settings of both of the first input terminal and the second input terminal from invalid to valid. In this case, the signal detector 721 may not include the switching element such as the field effect transistor.

When the motor 43 is stopped, the controller 9 changes the state of the power supply voltage detector 10 to a state in which the power supply voltage detector 10 is capable of detecting a signal. In this case, the power supply voltage detector 10 includes, for example, a switching element such as a field effect transistor between the power supply voltage detector 10 and the driving power supply 8. That is, the controller 9 controls the switching element to thereby change a state in which power supply from the driving power supply 8 is stopped to a state in which electric power is supplied from the driving power supply 8. Consequently, the controller 9 changes the state of the power supply voltage detector 10 to the state in which the power supply voltage detector 10 is capable of detecting a signal. The controller 9 may be configured to change, with another method, the state of the power supply voltage detector 10 to the state in which the power supply voltage detector 10 is capable of detecting a signal.

The controller 9 may be configured not to, when the motor 43 is stopped, receive a signal corresponding to a power supply voltage detected by the power supply voltage detector 10. That is, in the case, the controller 9 changes, from valid to invalid, an input setting of a terminal that receives a signal input from the power supply voltage detector 10. In this case, the signal detector 721 may not include a switching element such as a field effect transistor.

The controller 9 explained above may be configured to, when the operation mode of the printer 1 is the normal mode and a signal is input to the second signal input terminal from the signal output terminal of the operational amplifier O1, change conveying speed of the medium by the motor 43 with feedback control. For example, in such a case, with the method explained above, the controller 9 calculates moving length of the medium pulled in the conveying direction of the medium and calculates, based on the calculated length and an elapsed time, moving speed of the medium in the conveying direction of the medium. The controller 9 performs such calculation of the moving speed at a predetermined period. The period is, for example, 0.1 second. The period may be a period shorter than 0.1 second or may be a period longer than 0.1 second. The controller 9 changes, based on the calculated moving speed, printing speed for printing an image on the medium. In this case, the controller 9 specifies, based on information associating the moving speed and the printing speed, printing speed suitable for the calculated moving speed. The information is, for example, a table associating the moving speed and the printing speed.

The controller 9 explained above may be configured to, when the operation mode of the printer 1 is the normal mode and a signal is input to one or both of the first signal input terminal and the second signal input terminal from the signal output terminal of the operational amplifier O1, store, as a history, information indicating that a counterelectromotive force is generated in the motor 43. Consequently, even when the printer 1 stops because of the high voltage error, the printer 1 can easily specify a cause of the high voltage error.

The controller 9 explained above may be configured to, when the operation mode of the printer 1 is the normal mode and a signal is input to one or both of the first signal input terminal and the second signal input terminal from the signal output terminal of the operational amplifier O1, inform information indicating deviation of the position of the medium to the user of the printer 1. For example, the controller 9 informs the information to the user with lighting of a lamp included in the printer 1, sounding of a buzzer included in the printer 1, an output of the information to another device, or the like.

The controller 9 explained above may be configured to include one of the first signal input terminal and the second signal input terminal instead of the configuration including both of the first signal input terminal and the second signal input terminal.

As explained above, a printer according to the embodiment includes a motor configured to convey a medium and a controller configured to control the motor. The controller acquires a signal corresponding to a counterelectromotive force of the motor and performs processing based on the acquired signal. Consequently, the printer can make a rotary encoder unnecessary and reduce power consumption. In the example explained above, the printer is the printer 1, the medium is the roll paper 20, the motor is the motor 43, the controller is the controller 9, and the signal is the counter-electromotive force signal.

In the printer, a configuration may be used in which the controller stops the motor, changes an operation mode from a normal mode to an energy saving mode, and, when the operation mode is the energy saving mode, acquires the signal.

A configuration may be used in which the printer further includes a differential amplifier circuit, and the differential amplifier circuit amplifies the signal and receives, as an interrupt signal, the signal amplified by the differential amplifier circuit.

In the printer, a configuration may be used in which the controller causes a motor to perform rewinding of the medium by length corresponding to the signal.

A configuration may be used in which the printer further includes a cutter configured to cut the medium, and the controller causes, based on the acquired signal, the cutter to cut the medium. In the example explained above, the cutter is the cutter 36.

In the printer, a configuration may be used in which the medium is a label sheet on which one or more labels are stuck, and the printer further includes a position detector configured to detect a position of the label on the label sheet.

A configuration may be used in which the printer further includes a signal detector configured to detect the signal and a power supply voltage detector configured to detect a power supply voltage of the motor, and, when the motor is stopped, the controller changes a state of the signal detector to a state in which the signal detector is capable of detecting the signal and changes a state of the power supply voltage detector to a state in which the power supply voltage detector is incapable of detecting the power supply voltage. In the example explained above, the signal detector is the signal detector 721 and the power supply voltage detector is the power supply detector 10.

A configuration may be used in which the printer further includes a signal detector configured to detect a signal and a power supply voltage detector configured to detect a power supply voltage of the motor, and, when the motor is stopped, the controller receives the signal detected by the signal detector and does not receive a signal corresponding to the power supply voltage detected by the power supply voltage detector.

The embodiment of the present disclosure is explained in detail above with reference to the drawings. However, a specific configuration is not limited to the embodiment. Changes, substitutions, deletions, and the like of the configuration may be made without departing from the gist of the present disclosure.

A program for realizing the functions of any components in the device explained above may be recorded in a computer-readable recording medium. The program may be read and executed by a computer system. The device is, for example, the controller 9. It is assumed that the "computer system" includes an OS (Operating System) and hardware such as peripheral devices. The "computer-readable recoding medium" refers to a portable medium such as a flexible disk, a magneto-optical disk, a ROM, or a CD (Compact Disk)-ROM or a storage device such as a hard disk incorporated in the computer system. Further, it is assumed that the "computer-readable recording medium" includes a recording medium that retains the program for a fixed time like a volatile memory inside the computer system functioning as a server or a client when the program is transmitted via a network such as the Internet or a communication line such as a telephone line.

The program may be transmitted from the computer system that stores the program in the storage device or the like to another computer system via a transmission medium or by a transmission wave in the transmission medium. The "transmission medium" for transmitting the program refers to a medium having a function of transmitting information like a network such as the Internet or a communication line such as a telephone line.

The program may be a program for realizing a part of the functions explained above. Further, the program may be a program that can realize the functions in a combination with a program already recorded in the computer system, that is, a so-called differential file or differential program.

The functional sections shown in FIGS. 3 and 6 indicate functional components. Specific implementation forms of the functional sections are not particularly limited. That is, hardware individually corresponding to the functional sections does not always need to be implemented. It is naturally possible to adopt a configuration in which one processor executes programs to realize functions of a plurality of functional sections. A part of the functions realized by software in the embodiment explained above may be realized by hardware. Alternatively, a part of the functions realized by hardware in the embodiment may be realized by software. Besides, the specific detailed configurations of the other sections of the printer 1 can also be optionally changed without departing from the gist of the present disclosure.

What is claimed is:

1. A printer comprising:
a motor configured to convey a medium; and
a processor configured to control the motor, wherein
the processor is configured to perform predetermined processing based on receiving a signal corresponding to a counterelectromotive force of the motor, and
wherein the predetermined processing includes causing the motor to perform rewinding of the medium by a length corresponding to the signal.

2. The printer according to claim 1, wherein the processor changes an operation mode from a normal mode in which the motor can be driven to an energy saving mode in which the motor is stopped and, when the operation mode is the energy saving mode, receives the signal.

3. The printer according to claim 2, further comprising a differential amplifier circuit, wherein the differential amplifier circuit amplifies the signal, and the processor receives, as an interrupt signal, the signal amplified by the differential amplifier circuit even when the operation mode is the energy saving mode.

4. The printer according to claim 1, wherein the medium is a label sheet on which one or more labels are stuck, and the printer further comprises a position detector configured to detect a position of the label on the label sheet.

5. The printer according to claim 1, further comprising:

a signal detector configured to detect the signal; and a power supply voltage detector configured to detect a power supply voltage of the motor, wherein when the motor is stopped, the processor changes a state of the signal detector to a state in which the signal detector is capable of detecting the signal and changes a state of the power supply voltage detector to a state in which the power supply voltage detector is incapable of detecting the power supply voltage.

6. The printer according to claim 1, further comprising:

a signal detector configured to detect the signal; and a power supply voltage detector configured to detect a power supply voltage of the motor, wherein when the motor is stopped, the processor receives the signal detected by the signal detector and does not receive a signal corresponding to the power supply voltage detected by the power supply voltage detector.

7. A printer, comprising:

a motor configured to convey a medium;

a cutter configured to cut the medium; and a processor configured to control the motor, wherein the processor is configured to perform predetermined processing based on receiving a signal corresponding to a counterelectromotive force of the motor, and wherein the predetermined processing includes causing the cutter to cut the medium corresponding to the signal.

8. A control method for a printer including a motor configured to convey a medium, the control method comprising:

receiving a signal corresponding to a counterelectromotive force of the motor; and performing predetermined processing including causing the motor to perform rewinding of the medium by a length corresponding to the signal.

9. The control method for the printer according to claim 8, further comprising changing an operation mode from a normal mode in which the motor can be driven to an energy saving mode in which the motor is stopped and receiving the signal.

10. The control method for the printer according to claim 9, wherein the printer includes a differential amplifier circuit configured to amplify the signal, and the control method further comprises receiving, as an interrupt signal, the signal amplified by the differential amplifier circuit even when the operation mode is the energy saving mode.

11. The control method for the printer according to claim 8, wherein the medium is a label sheet on which one or more labels are stuck.

12. The control method for the printer according to claim 8, wherein the printer includes a signal detector configured to detect the signal and a power supply voltage detector configured to detect a power supply voltage of the motor, and the control method further comprises, when the motor is stopped, changing a state of the signal detector to a state in which the signal detector is capable of detecting the signal and changing a state of the power supply voltage detector to a state in which the power supply voltage detector is incapable of detecting the power supply voltage.

13. The control method for the printer according to claim 9, wherein the printer includes a signal detector configured to detect the signal and a power supply voltage detector configured to detect a power supply voltage of the motor, and the control method further comprises, when the motor is stopped, receiving the signal detected by the signal detector and not receiving a signal corresponding to the power supply voltage detected by the power supply voltage detector.

14. A control method for a printer including a motor configured to convey a medium and a cutter configured to cut the medium, the control method comprising:

receiving a signal corresponding to a counterelectromotive force of the motor; and performing predetermined processing including causing the cutter to cut the medium based on the signal.

* * * * *